(12) United States Patent
Cheng (10) Patent No.: US 10,784,370 B2
(45) Date of Patent: Sep. 22, 2020

(54) VERTICAL TRANSISTOR WITH UNIFORM FIN THICKNESS

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/044,723

(22) Filed: Jul. 25, 2018

(65) Prior Publication Data

US 2020/0035828 A1 Jan. 30, 2020

(51) Int. Cl.
| H01L 29/66 | (2006.01) |
| H01L 29/78 | (2006.01) |
| H01L 29/08 | (2006.01) |
| H01L 21/8238 | (2006.01) |
| H01L 21/768 | (2006.01) |

(52) U.S. Cl.
CPC .... *H01L 29/7827* (2013.01); *H01L 21/76829* (2013.01); *H01L 21/823864* (2013.01); *H01L 21/823885* (2013.01); *H01L 29/0847* (2013.01); *H01L 29/6656* (2013.01)

(58) Field of Classification Search
CPC ........... H01L 29/0847; H01L 29/41725; H01L 29/41741; H01L 29/7827; H01L 29/7831; H01L 29/6656; H01L 29/66772; H01L 29/66787; H01L 21/762; H01L 21/8232; H01L 21/238; H01L 21/823481; H01L 21/823456; H01L 21/823431; H01L 21/823821; H01L 21/82385; H01L 21/8238; H01L 21/823885; H01L 21/823871; H01L 21/823878; H01L 21/76829; H01L 21/823864; H01L 29/66795; H01L 29/6681; H01L 29/0642; H01L 29/785; H01L 29/7855; H01L 23/5329; H01L 29/7848; H01L 29/66545; H01L 21/28079; H01L 21/76895
USPC ......... 257/192, 365, 328, 329, 308; 438/283
See application file for complete search history.

(56) References Cited

U.S. PATENT DOCUMENTS

| 7,847,323 | B2 | 12/2010 | Cheng et al. |
| 9,536,793 | B1* | 1/2017 | Zhang ............. H01L 21/823828 |
| 9,553,194 | B1 | 1/2017 | Licausi et al. |
| 9,627,263 | B1 | 4/2017 | He et al. |
| 9,627,378 | B2 | 4/2017 | Ando et al. |
| 9,647,120 | B1* | 5/2017 | Bi .......................... H01L 23/535 |
| 9,711,535 | B2 | 7/2017 | Wang et al. |
| 2016/0315160 | A1* | 10/2016 | Lee ........................ H01L 29/785 |
| 2017/0084718 | A1 | 3/2017 | Wu et al. |
| 2018/0331213 | A1* | 11/2018 | Bentley ............... H01L 29/1033 |

* cited by examiner

*Primary Examiner* — Natalia A Gondarenko
(74) *Attorney, Agent, or Firm* — Patterson + Sheridan, LLP (57) ABSTRACT

Method and structures for forming vertical transistors with uniform fin thickness. A structure includes: a substrate, a plurality of fins over the substrate, a top and a bottom source/drain region in contact with the plurality of fins, respectively, where the bottom source/drain region has an alternating topography, and a bottom spacer in contact with the bottom source/drain region, where the bottom spacer conforms to the alternating topography of the bottom-source drain region.

10 Claims, 11 Drawing Sheets

VERTICAL TRANSISTOR WITH UNIFORM FIN THICKNESS

BACKGROUND

The present invention relates in general to semiconductor devices, and more specifically, to vertical-type transistors having uniform fin or channel thickness and methods of fabricating the same.

As demands to reduce the dimensions of transistor devices continue, new designs and fabrication techniques to achieve a reduced device footprint are needed. Vertical-type transistors such as vertical field effect transistors (vertical FETs) have recently been developed to achieve a reduced FET device footprint. While some FET performance characteristics are improved by using vertical FET designs, other vertical FET device performance characteristics can be adversely affect performance.

SUMMARY

According to one embodiment of the present disclosure, a structure is provided. The structure includes: a substrate, a plurality of fins over the substrate, a top and a bottom source/drain region in contact with the plurality of fins, respectively, wherein the bottom source/drain region has an alternating topography, and a bottom spacer in contact with the bottom source/drain region, wherein the bottom spacer conforms to the alternating topography of the bottom-source drain region.

According to one embodiment of the present disclosure, another structure is provided. The structure includes: a substrate, a plurality of fins for an nFET region over the substrate, a plurality of fins for a pFET region over the substrate, a bottom source/drain region for the nFET region, where the nFET bottom source/drain region is in contact with the nFET plurality of fins, and a bottom source/drain region for the pFET region, where the pFET bottom source/drain region is in contact with the pFET plurality of fins, and where the nFET source/drain region and the pFET source/drain have a substantially identical topography with respect to each other.

According to yet another embodiment of the present disclosure, a method for forming a structure is provided. The method includes: providing a substrate with a plurality of tapered fins over the substrate, depositing a sidewall spacer on each sidewall of each of the plurality of fins, and after depositing the sidewall spacer without an etch-stope layer, forming an opening in between each of the plurality of fins, wherein the opening contains a groove in the substrate.

DETAILED DESCRIPTION

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

One or more embodiments of the present disclosure includes providing for a method and structure for improving transistor functionality and mitigating extraneous processing steps, including formation of a vertical transistor in accordance with one or more techniques as described herein. In one embodiment, an embedded insulator layer or plug is formed prior to forming a source/drain region (S/D region), and in lieu of using an etch stop later in preceding processing steps. In one embodiment, the embedded etch stop layer allows for an accurate fin etch to establish a straightened and uniform fin profile. In one embodiment, the embedded etch stop layer can also serve as a dummy placeholder for bottom source/drain formation, which permits for a uniform source/drain region distribution across one or more devices along a substrate, e.g. an nFET and pFET device.

Figure 1:
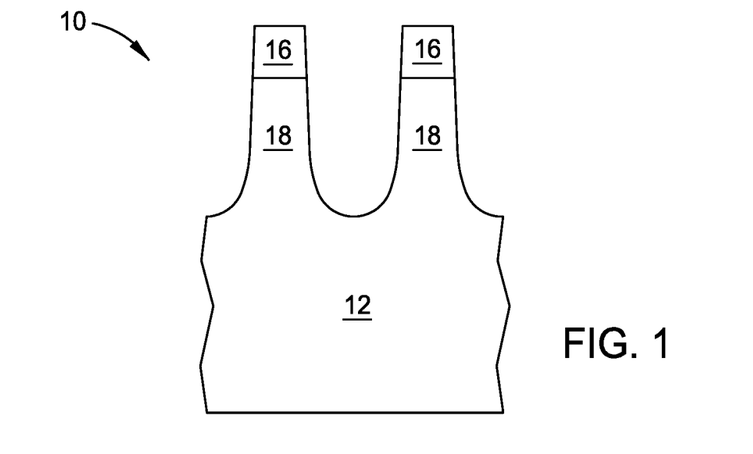
FIG. 1 illustrates a tapered semiconductor structure in accordance with at least one embodiment of the present disclosure.

FIG. 1 illustrates a partially fabricated and tapered semiconductor structure 10 in accordance with at least one embodiment of the present disclosure. The tapered device 10 includes a substrate 12, which may be a semiconductor or an insulator with an active surface semiconductor layer. The substrate may be crystalline, semi-crystalline, microcrystalline or amorphous. The substrate may be essentially (e.g., except for contaminants) a single element (e.g., silicon), primarily (e.g., with or without doping) of a single element, for example, silicon (Si) or germanium (Ge), or the substrate 12 may include a compound, for example, $Al_2O_3$, $SiO_2$, GaAs, SiC, or SiGe. The substrate 12 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 12 may also have other layers forming the substrate 12, including high-k oxides and/or nitrides. In one or more embodiments, the substrate 12 may be a silicon wafer, a semiconductor formed on silicon (e.g., InP on GaAs on Si), etc. In various embodiments, the substrate 12 may be a single crystal silicon (Si), silicon germanium (SiGe), or III-V semiconductor (e.g., GaAs, InP) wafer, or have a single crystal silicon (Si), silicon germanium (SiGe), or III-V semiconductor (e.g., GaAs) surface/active layer. In the present embodiment, the substrate 12 will illustratively be described as InP, which may be formed on GaAs over Si.

The hard mask 16 can be any suitable oxide, nitride, or other suitable material, including silicon oxycarbonitride (SiOCN) or silicon oxycarbide (SiOC). Appropriate lithographic and patterning steps are performed on tapered structure in order to a plurality of fins. Pursuant to at least one embodiment, a hardmask 16 is deposited over the pre-tapered, e.g. a silicon substrate, using any suitable deposition technique. An etching (e.g., RIE) process is applied to the pre-tapered structure, resulting in structure 10 as shown, and to create a plurality of tapered fins 18. In one embodiment, the pre-tapered structure is formed by a suitable lithography technique, e.g., extreme ultraviolet lithography (EUV)) followed by etching (e.g. RIE). Other suitable techniques such as sidewall image transfer (SIT), self-aligned double patterning (SADP), self-aligned multiple patterning (SAMP), self-aligned quadruple patterning (SAQP) can be used. In one embodiment, the tapering of the fins occurs as result of the etch process taking place without an etch stop layer forming an initial opening or trench 18b with a "U" shape (to start) between the fins 18 and/or a tapered shape in association with the fins 18 (as shown). In one embodiment, the etching (e.g., dry etching) and time are tuned to develop a trapezoidal shape for the plurality of tapered fins 18. For example, after the etching reaches its end point (e.g., stop on substrate 12), reduction in over-etch time can be tuned to obtain tapered fins.

Figure 2:
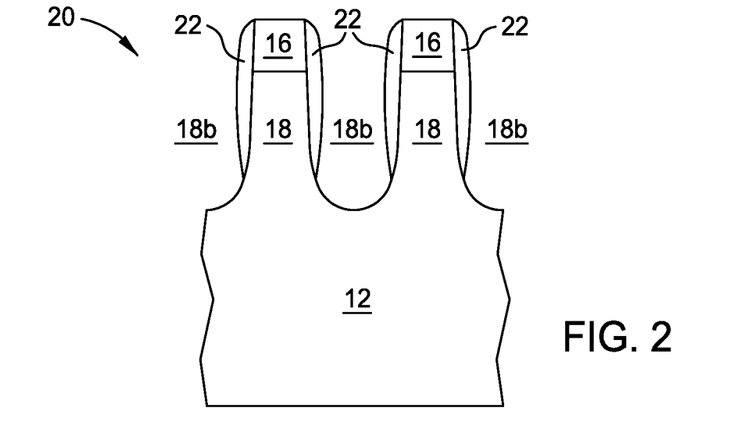
FIG. 2 illustrates a semiconductor structure with spacers in accordance with at least one embodiment of the present disclosure.

FIG. 2 illustrates a spacer formation process on structure 10 in accordance with at least one embodiment of the present disclosure, which results in structure 20. One or more sidewall spacers 22 are formed using suitable conformal deposition techniques and etch techniques. In one embodiment, where the sidewall spacers can include any suitable spacer material, including but not limited to a nitride or oxide, e.g. silicon oxide (SiO), silicon nitride (SiN), silicon oxynitride (SiON), silicon carbide (SiC), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and combinations thereof.

Figure 3:
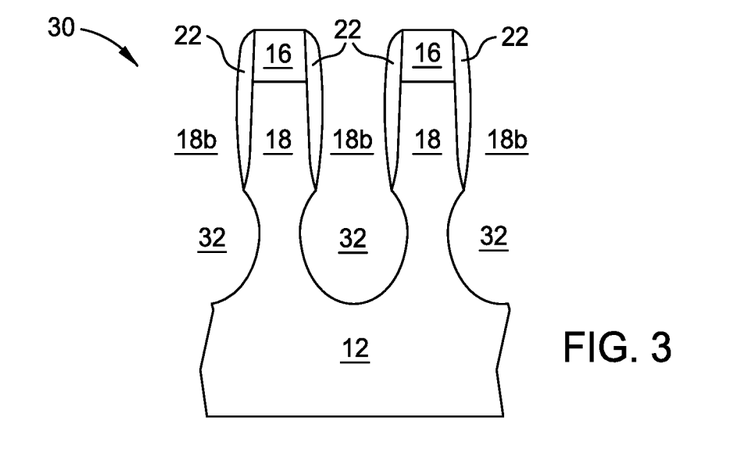
FIG. 3 illustrates an etching process in accordance with at least one embodiment of the present disclosure.

FIG. 3 illustrates performing an etch process on structure 20, for forming grooved trenches 32 in openings 18b, resulting in structure 30. A suitable etch process, selective to the material of the plurality of fins 18, e.g. Si, and directed at the bottom portion of the fins 16. According to one embodiment, an isotropic Si etch process may be employed for this purpose and the etch process can be selective to the material of the fins and substrate, e.g. Si or SiGe. Hydrofluoric nitric acid (HNA) can be employed for the isotropic etching of silicon. In one embodiment, a silicon etch processes is employed, where a wet etch is applied with a solution containing one or more of ammonium hydroxide ($NH_4OH$), tetramethylammonium hydroxide (TMAH), hydrazine, ethylene diamine pyrocatechol (EDP), HF/Nitric/Acetic Acid (HNA), potassium hydroxide (KOH). In one embodiment a dry etch is applied, e.g. a technique employing fluorine-containing gas or plasma (fluorides (e.g., Xenon Difluoride ($XeF2$)), or Interhalogen ($BrF3$ or $ClF3$)), Sulfur hexafluoride ($SF6$), Hydrogen chloride (HCl). In one embodiment, the dry etch and wet etch technique can also be combined. This process can be timed so that the Si fin is laterally etched, so that grooves 32 are formed in structure 20. The silicon etching process is selective to the fin material, e.g. Si, such that the silicon is etched at a faster rate than any other materials of the structure 30. In one or more embodiments, the selective silicon etching is a dry etch process (e.g., plasma etch). In one embodiment, a directional RIE process can be applied to the structure 20 prior to performing the isotropic etch, where this is done to better isolate the portion of the structure where the grooves 32 will be formed. In one embodiment, the lateral etch results in the width of the fin in the narrowest portion in the lateral etched portion is smaller than the width of the fin top right under the fin hardmask 16.

Figure 4A:
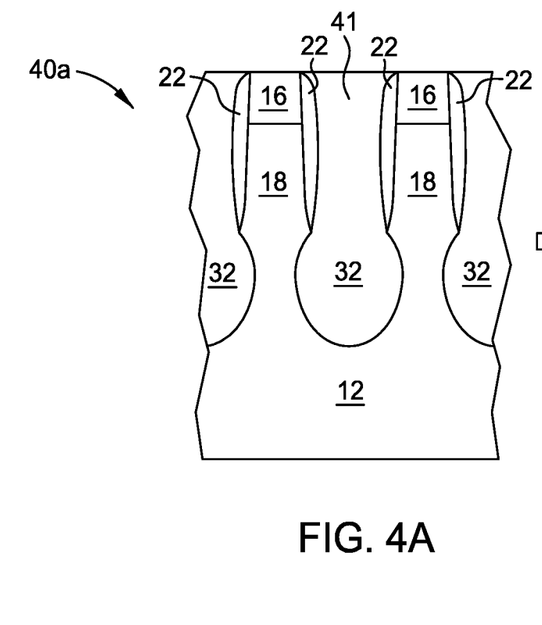
FIG. 4A illustrates an insulator deposition process in accordance with at least one embodiment of the present disclosure.
Figure 4B:
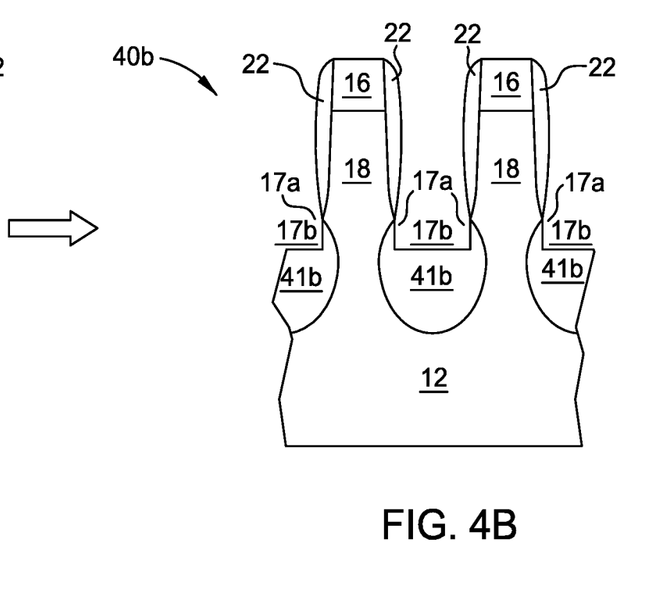
FIG. 4B illustrates an insulator deposition process in accordance with at least one embodiment of the present disclosure.

FIG. 4A and FIG. 4B illustrate formation of sacrificial plug for structure 30, resulting in structure 40a and 40b, respectively. In one embodiment, the plug is sacrificial and serves as an etch stop layer when performing a fin straightening process. In one embodiment, the sacrificial plug 41b can be an insulator, and in another embodiment it can also be a conductor, for example, such as titanium, titanium nitride, etc., provided the plug material has etch selectivity to the substrate.

In one embodiment, the trenches or openings 18b are filled with insulator material 41, such as an oxide. In one embodiment, as shown in FIG. 4A, the insulator material 41 is deposited using a CVD process or a plasma enhanced CVD (PECVD), followed by an etch back process or planarization process, e.g., chemical mechanical polish (CMP). In one embodiment, the trench is filled using a flowable oxide followed by an anneal process. In one embodiment, the oxide fill 41 is formed from a flowable oxide process, and if desired, followed by a partial recess process, e.g., etch back, and replaced with a high quality high-density-plasma (HDP), CVD oxide. In one embodiment, after deposition of the oxide takes place, as shown, the oxide is planarized using any suitable planarization, e.g. CMP and/or etch process to make the oxide coplanar with the rest of structure 40a. In one embodiment, after deposition of the insulator fill 41, e.g. oxide fill, a suitable etch process such as RIE is applied to the fill 41 to create sacrificial plugs 41b in the trench grooves. In one embodiment, as a result of the directional nature of the etching, each side 17a of the plug 41b extends higher than a rest of the plug 17b, which is more uniform. In one embodiment, as discussed, the shape of the plug can influence the final topography of a source/drain region to be deposited later on in the process (as discussed below).

Figure 5A:
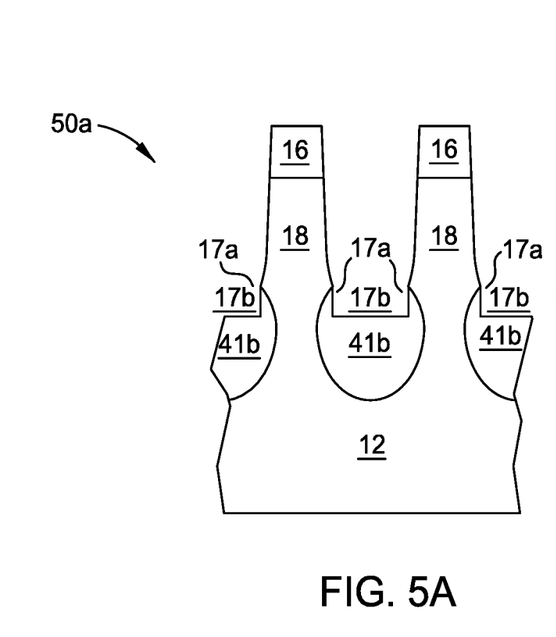
FIG. 5A illustrates a tapered structure in accordance with at least one embodiment of the present disclosure.
Figure 5B:
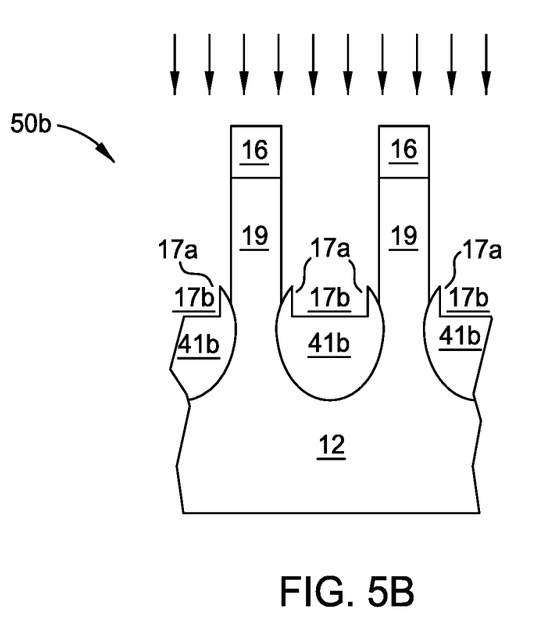
FIG. 5B illustrates applying an etching process to the tapered structure of FIG. 5A in accordance with at least one embodiment of the present disclosure.

FIG. 5A and FIG. 5B illustrate a processing for straightening the tapered plurality of fins 18, resulting in structures 50a and 50b. In one embodiment, a suitable etching process, e.g. a wet etch or an isotropic dry etch, is used to remove the sidewall spacers 22 in contact with the plurality of fins 18, resulting in structure 50a. In one embodiment, after removal of the sidewall spacers 22, a directional etch, e.g. RIE, selective to the material of the hardmask 16, is used to straighten the plurality of fins 18, resulting in a straightened plurality of fins 19, and where the sacrificial plug 41b, e.g. an oxide plug, serves as an etch stop layer for the selective etch process, resulting in structure 50b. In one embodiment, the straightening technique etches silicon fins (e.g., by directional silicon etch such as reactive ion etch (RIE)) that are not vertically aligned to the fin hardmask 16, and one or more oxide plugs serve as the etch stop layer, preventing silicon further etch into the substrate. The straightened fin profile provides enhanced device performance by making all channels/fins associated with the device more uniform.

Figure 6A:
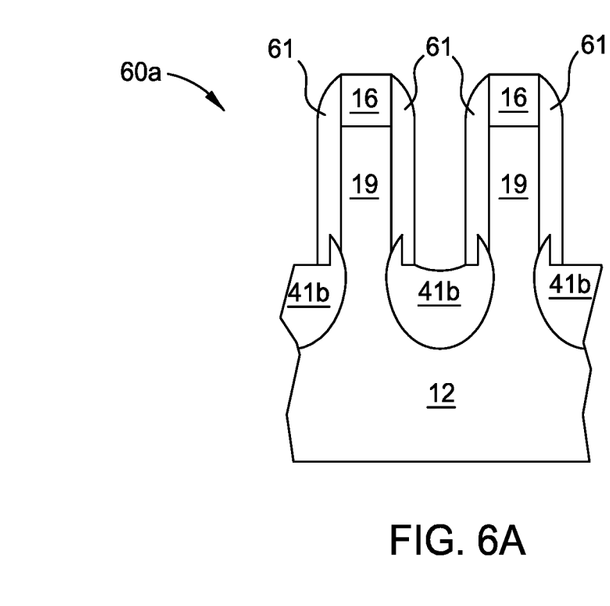
FIG. 6A illustrates a spacer deposition process in accordance with at least one embodiment of the present disclosure.
Figure 6B:
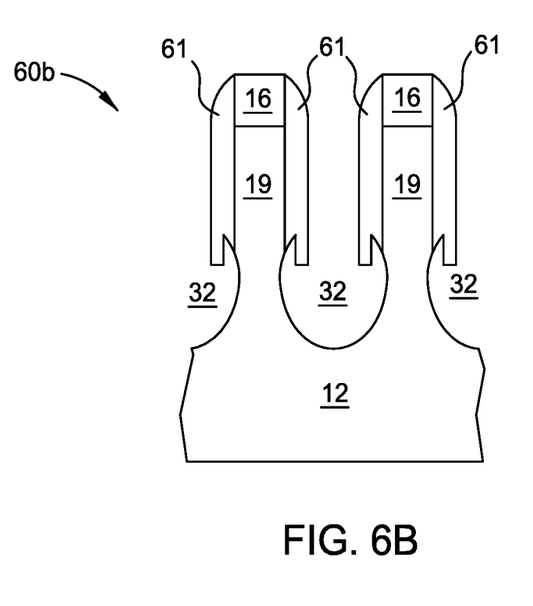
FIG. 6B illustrates an etching process applied to the structure of FIG. 5B in accordance with at least one embodiment of the present disclosure.

FIG. 6A and FIG. 6B illustrate a process for removing the sacrificial plug 41b, resulting in structures 60a and 60b, respectively. In one embodiment, another one or more sidewall spacers 61 are deposited on each sidewall of the plurality of straightened fins 19 before removing the plug 41b. As above, the one or more sidewall spacers 61 are formed using suitable conformal deposition techniques and etch techniques, resulting in structure 60a. In one embodiment, the sidewall spacers can include any suitable spacer material, including but not limited to a nitride or oxide, e.g. silicon oxide (SiO), silicon nitride (SiN), silicon oxynitride (SiON), silicon carbide (SiC), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and combinations thereof. In one embodiment, since each side of the plug 41a extends higher than the rest of the plug 41b, each side 41a will hook underneath the one or more sidewall spacers 61, which will ultimately affect the bottom topography of the completed vertical transistor device as described herein. In one embodiment, the sacrificial plug 41b will be removed using any suitable etch technique selective to other. In one embodiment, the plug 41b is oxide which can be selectively removed by using oxide etch (e.g., a wet etch solution containing hydrogen fluoride (HF)), resulting in structure 60b and re-exposing grooved trenches 32.

Figure 7A:
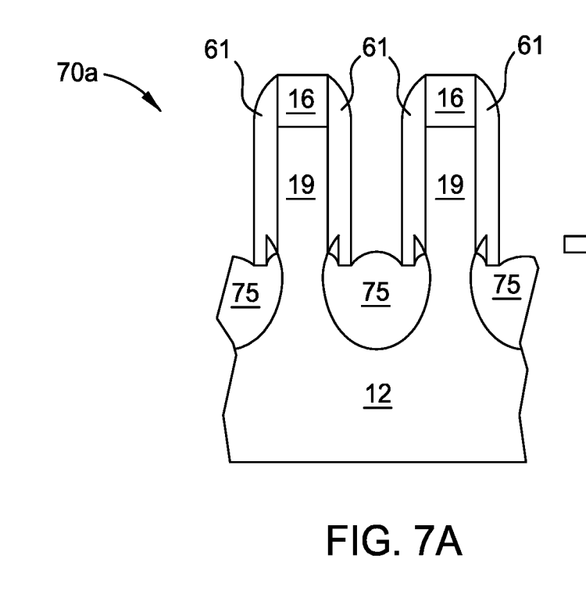
FIG. 7A illustrates development of a source/drain region in accordance with at least one embodiment of the present disclosure.
Figure 7B:
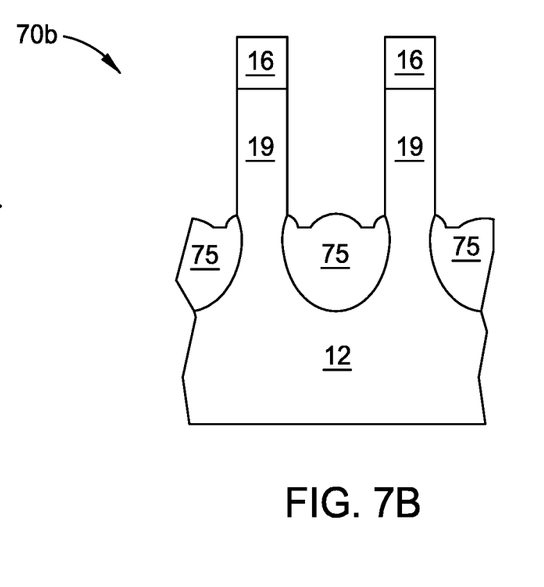
FIG. 7B illustrates development of a source/drain region in accordance with at least one embodiment of the present disclosure.

FIG. 7A and FIG. 7B illustrates forming a bottom source/drain epitaxy (bottom S/D region by epitaxial growth) for structure 60b, resulting in structure 70a and 70b, respectively. In FIG. 7A an, an in-situ doped source/drain (S/D) epitaxial growth process is performed to grow S/D regions 75 in grooves 32. The epitaxial growth is such that the underlying substrate 12 is epitaxially matched to the deposited/grown material for S/D regions 75.

The S/D epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRP-CVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1 \times 10^{19}$ cm$^{-3}$ to about $2 \times 10^{21}$ cm$^{-3}$, or preferably between $2 \times 10^{20}$ cm$^{-3}$ to $1 \times 10^{21}$ cm$^{-3}$. If an nFET device is desired, and depending on the underlying substrate material and the deposited S/D epitaxial material, suitable n-type dopants include arsenic, phosphorus, antimony, tellurium, and selenium. If a pFET device is desired, and depending on the underlying substrate material and the deposited S/D epitaxial material, suitable p-type dopants include boron, aluminum, gallium, indium, magnesium, and zinc.

In one embodiment, the underlying substrate 12 and plurality of straightened fins 19 are formed from substantially pure Si, and the S/D epitaxy 75 is a phosphorous-doped Si epitaxy, resulting in an nFET device. In one embodiment, the underlying substrate and plurality of straightened fins are formed from either Si or SiGe and the S/D epitaxy 75 can be a SiGe epitaxy doped with boron to form a pFET device. These two examples are exemplary, and other material combinations are contemplated, including but not limited to a Silicon-Carbon (Si:C) S/D epitaxy.

In one embodiment, when Si:C is epitaxially grown, the Si:C layer may include carbon in the range of 0.2% to 3.0%. In one embodiment, when SiGe is epitaxially grown, the SiGe may have germanium content in the range of 5% to 80%, or preferably between 20% and 60%. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. After growth of the S/D epitaxy, resulting in structure 70a, the sidewall spacers 61 are removed using any suitable technique, e.g., isotropic etch. In one embodiment, the sidewall spacers comprise silicon nitride, which can be selectively removed by a wet etch solution containing phosphoric acid.

Figure 8A:
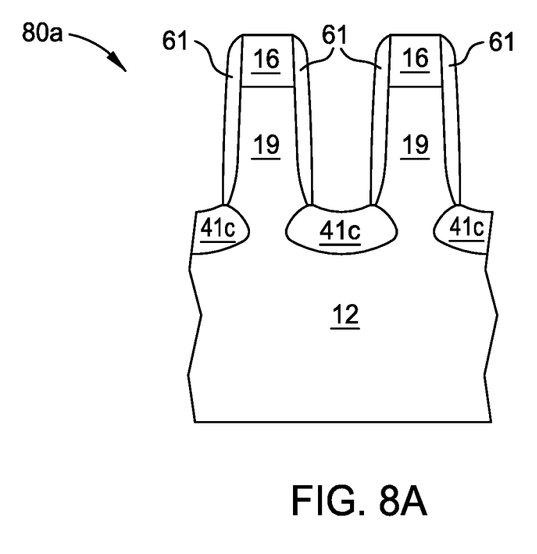
FIG. 8A illustrates formation of an oxide plug by thermal oxidation in accordance with at least one embodiment of the present disclosure.
Figure 8B:
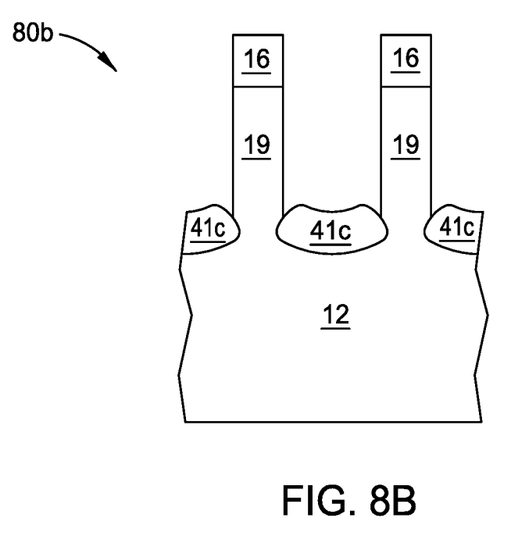
FIG. 8B illustrates forming a source/drain region by performing one or more processing steps on the structure of FIG. 8A, and in accordance with at least one embodiment of the present disclosure.

Referring back to FIG. 4A and FIG. 4B, and in relation to FIG. 8 A and FIG. 8B, another technique for forming a sacrificial plug is provided, resulting in structure 80a and 80b. In one embodiment, instead of using a fill and performing an etching step, an oxide plug 41c can be formed using thermal oxidation. In one embodiment, this is useful because it removes one or more processing steps, e.g. a subsequent etch step. Thermal oxidation can also alter the topography of the plug, which by extension will impact the topography of the to-be-deposited S/D region.

In one embodiment, thermal oxidation process is carried out by annealing the substrate 12 in oxygen ambient under conditions sufficient to form the thermal oxide that completely fills the grooves 32, while the sidewall spacers 61 prevent formation of oxide on the sidewalls of the fins. According to an embodiment, the thermal oxidation is carried out at a temperature of from about 750° C. to about 1300° C., and ranges therebetween, for a duration of from about 5 seconds (sec) to about 10 hours, and ranges therebetween. The thermal oxidation process can be performed by using rapid thermal oxidation (RTO), furnace oxidation, in-situ steam generation (ISSG) oxidation. The oxidation process can be a dry oxidation process (e.g., oxidation with oxygen gas), or wet oxidation (oxidation with a mix of oxygen gas and hydrogen gas, or water vapor). Other suitable oxidation process can also be used.

It is notable that the formation of the thermal oxide in the trenches 32 is a self-limiting process. Namely, due to volume expansion, the thermal oxide will expand laterally inside the grooves 32 until the thermal oxide growing on opposing fin sidewalls meets in the grooves 32. Thus, as provided above, even if the openings to the trenches get closed off, the thermal oxide will continue to grow within the trenches until the trenches are completely filled and thus void-free. This results in a semiconductor structure In one embodiment, as shown, structure 80a begins in the same form as structure 20, with the only difference that one or more etch steps and a separate deposition step can be avoided by virtue of the oxidation process. Moreover, as stated, and as shown, the oxide plug 41c of structure 80a will provide for a different topography for the to-be-formed source/drain region, as shown in structure FIG. 8B. As shown in FIG. 8B, after formation of plug 41c, in one embodiment, the same processing steps as described above, e.g. spacer removal, fin straightening, spacer deposition, oxide removal, and source/drain epitaxial growth, are performed, in any manner as described herein or otherwise known, on structure 80a, resulting in source/drain region 75c and structure 80b.

Figure 9A:
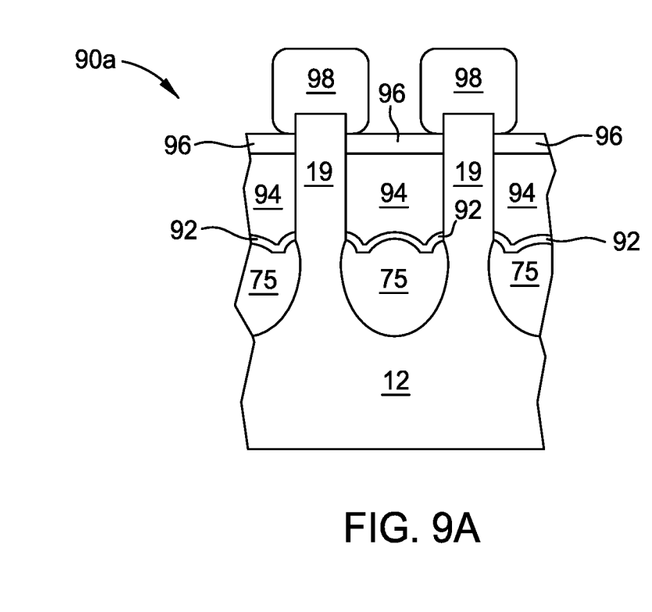
FIG. 9A illustrates development of one or more vertical transistor layers in accordance with at least one embodiment of the present disclosure.

FIG. 9A illustrates performing one or more vertical transistor steps to structure 70b, resulting in structure 90a. Transistor finalization can include any suitable technique(s) to form a either a pFET or nFET, including bottom spacer 92, a gate 94, a top spacer 96, top source/drain regions 98, contacts (not shown), inter-layer dielectric(s) (not shown), back-end of the line (BEOL) wiring etc. The bottom spacer 92 topography will be governed by the topography of the source/drain region 75, which in turn will be governed by the sacrificial plug 41b. In one embodiment, the source/drain region 75 and the bottom spacer 92 have a uniform but alternating topography (rising and falling slopes) in relation to the fins 19.

Figure 9B:
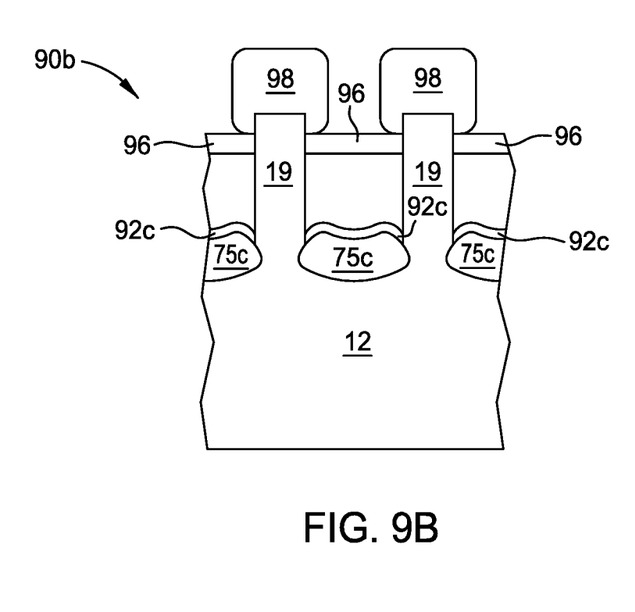
FIG. 9B illustrates development of one or more vertical transistor layers in accordance with at least one embodiment of the present disclosure.

FIG. 9B illustrates performing one or more vertical transistor steps to structure 80b, resulting in structure 90b. Transistor finalization can include any suitable technique(s) to form a either a pFET or nFET, including bottom spacer 92c, a gate 94, a top spacer 96, top source/drain regions 98, contacts (not shown), inter-layer dielectric(s) (not shown), back-end of the line (BEOL) wiring etc. The bottom spacer 92c topography will be governed by the topography of the source/drain region 75c, which in turn will be governed by the plug 41c. In one embodiment, the source/drain region 75c and the bottom spacer 92c have a uniform but alternating topography (rising and falling slopes) in relation to the fins 19. In one embodiment, since the bottom source/drain region of structure 80b is associated with a plug 41c determined by thermal oxidation, the topography, although uniform, is different from the topography of structure 90a.

Although not shown, depending on the required subsequent processing steps, another set of sidewall spacers could be deposited on the fin 19 sidewalls of either structure 70b and 80b.

Figure 10:
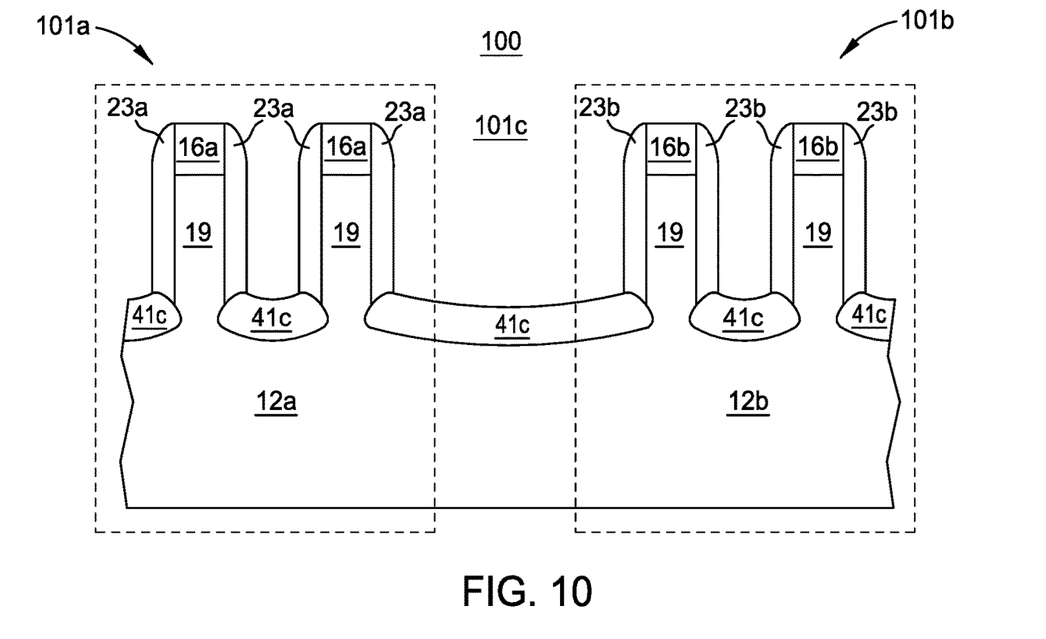
FIG. 10 illustrates a semiconductor structure with a basis for a pFET and a basis for an nFET region in accordance with at least one embodiment of the present disclosure.

FIG. 10 illustrates structure 100, which is a semiconductor structure providing the basis for forming both an nFET and a pFET structure on a substrate 12a in accordance with one or more embodiments of the present disclosure. In accordance with the techniques described in this disclosure, and according to an embodiment, a basis for an nFET region 101a, which includes spacers 23a, straightened fins 19a, oxide plug(s) 41c, and hardmask 16a is provided. In accordance with the techniques described in this disclosure, and according to an embodiment, a basis for a pFET region 101b, which includes spacers 23b, straightened fins 19b, oxide plug(s) 41c, and hardmask 16b is provided. It is noted that according to an embodiment, oxide plug(s) 41 c can be formed during a single oxidation step for both regions, as discussed above in relation to formation of a single device region. It should be also noted that although an embodiment is provided where a plug, e.g. oxide plug, is provided by thermal oxidation, other insulator deposition techniques as described herein or otherwise known can be used as well.

Figure 11:
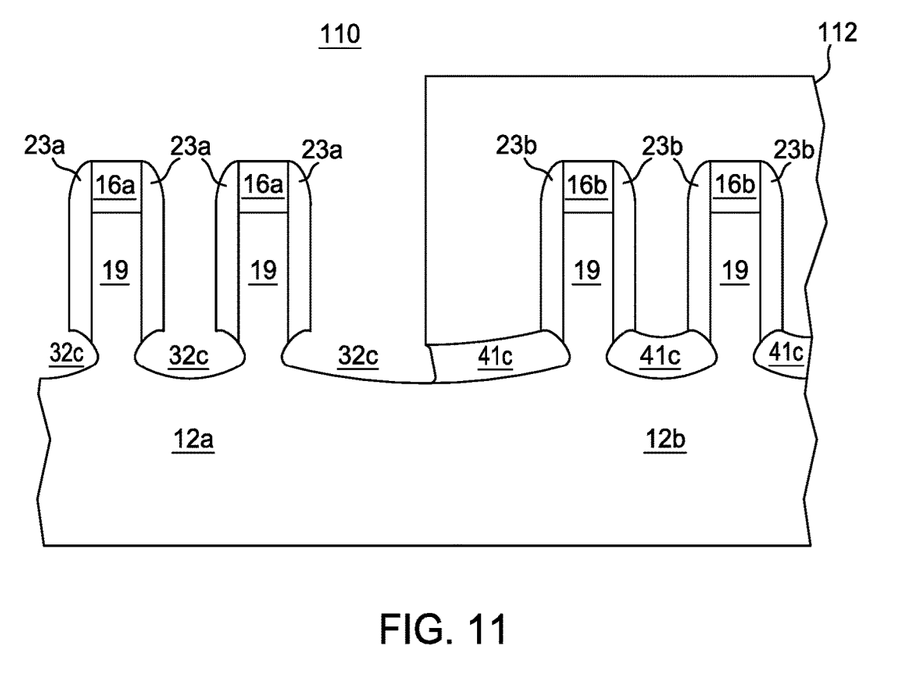
FIG. 11 illustrates forming an nFET region in accordance with at least one embodiment of the present disclosure.

FIG. 11 illustrates depositing a mask over one region of structure 100, e.g. the pFET region 101b (although the reverse is possible) and recessing one or more oxide plugs 41c, resulting in structure 110. A mask 112 is deposited over 101b using any suitable techniques, where the mask 112 can be a photoresist, hard mask, optical planarization layer (OPL), or other suitable material. Thereafter, the oxide plugs 41c in the nFET region 101a are removed using an etch process, e.g. a suitable wet etch or RIE, where the mask 112 protects the pFET region from the etch step, resulting in exposition of grooves 32c (where the grooves would be formed during thermal oxidation as described herein).

Figure 12:
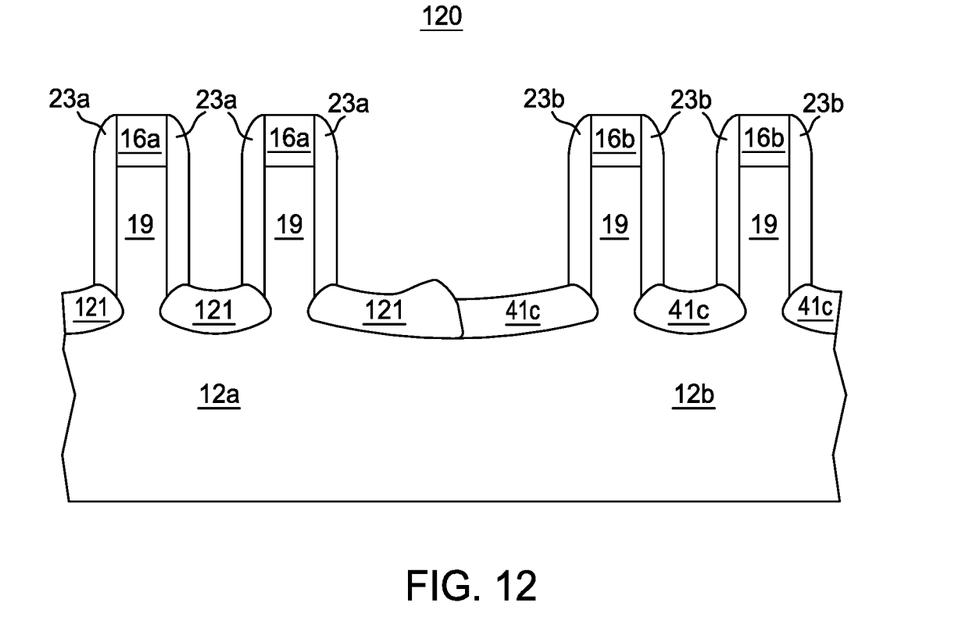
FIG. 12 illustrates forming an nFET region in accordance with at least one embodiment of the present disclosure.

FIG. 12 illustrates structure 120, which epitaxially grows a suitable nFET source/drain region material in grooves 32c. The mask 112 is removed using any suitable etch process, e.g., oxygen plasma etch to remove photoresist or OPL mask. Thereafter, an epitaxial growth and doping process is initiated, as provided for herein, to grow source/drain epitaxy 121 in grooves 32c, where according to an embodiment the source/drain epitaxy can be any suitable material useful for an nFET structure, e.g. phosphorous-doped silicon epitaxy 121. It is noted that the epitaxy 121 will not grow on the pFET side due to the remaining presence of the insulator, e.g. oxide, plug 41c still present in the pFET region, and no epitaxy grows on fin sidewalls protected by the spacers.

Figure 13:
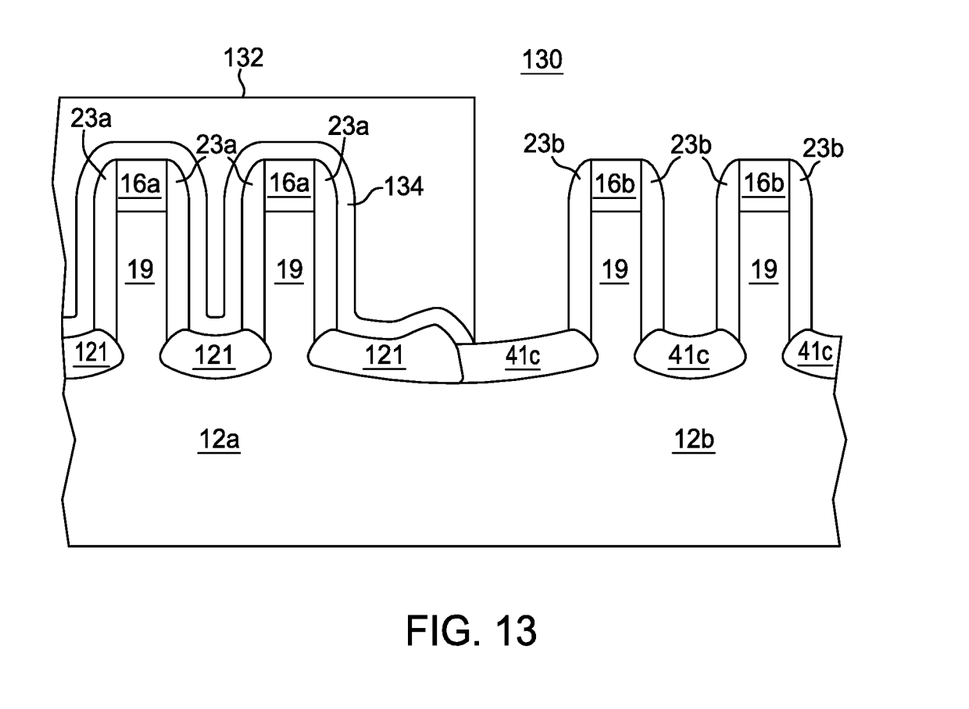
FIG. 13 illustrates forming a pFET region in accordance with at least one embodiment of the present disclosure.
Figure 14:
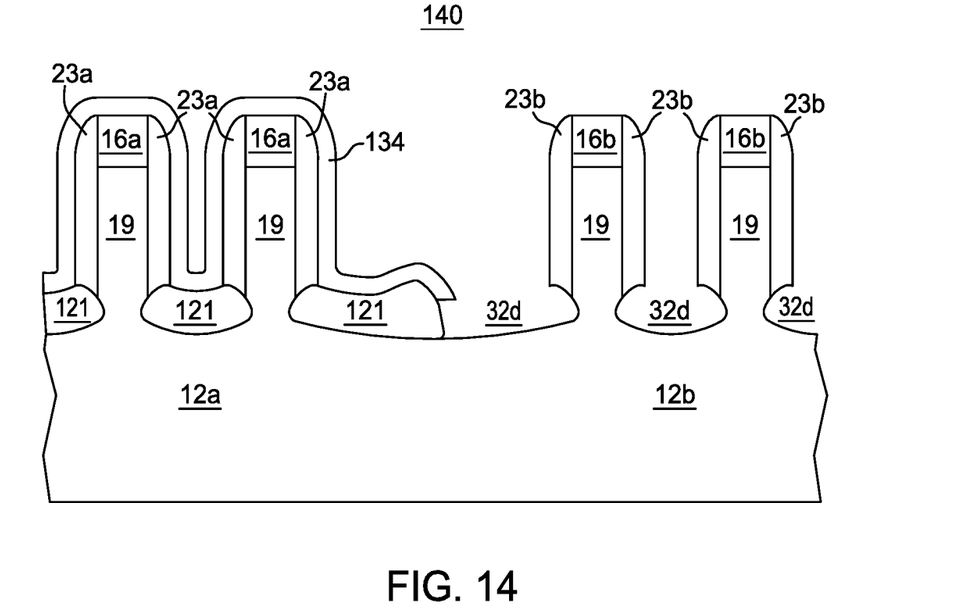
FIG. 14 illustrates forming a pFET region in accordance with at least one embodiment of the present disclosure.

FIG. 13 illustrates performing a liner deposition and patterning process on structure 120, resulting in structure 130, and FIG. 14 illustrates removal of the remaining oxide plugs 41c, resulting in structure 140. A liner 134 is deposited over spacers 23a and the epitaxy 121 using any suitable deposition technique, where the liner can be a nitride based material, such as silicon-nitride. Thereafter, a mask 132 is deposited over the nFET region 101a, including the liner 134. Patterning techniques (e.g., lithography followed by etching) can be used to remove the liner 134 in pFET region. The oxide 32 is removed in the pFET side 101b using any suitable technique already discussed or otherwise known, and the mask 132 is also removed using any suitable technique already discussed or otherwise known, resulting in exposition of grooves 32d and structure 140.

Figure 15:
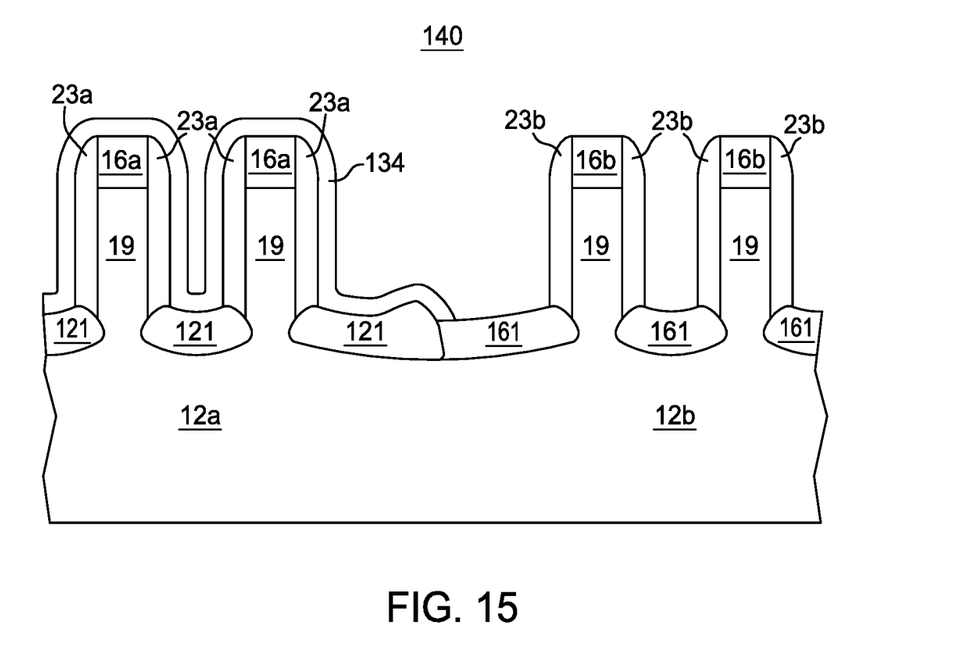
FIG. 15 illustrates forming a pFET region in accordance with at least one embodiment of the present disclosure.
Figure 16:
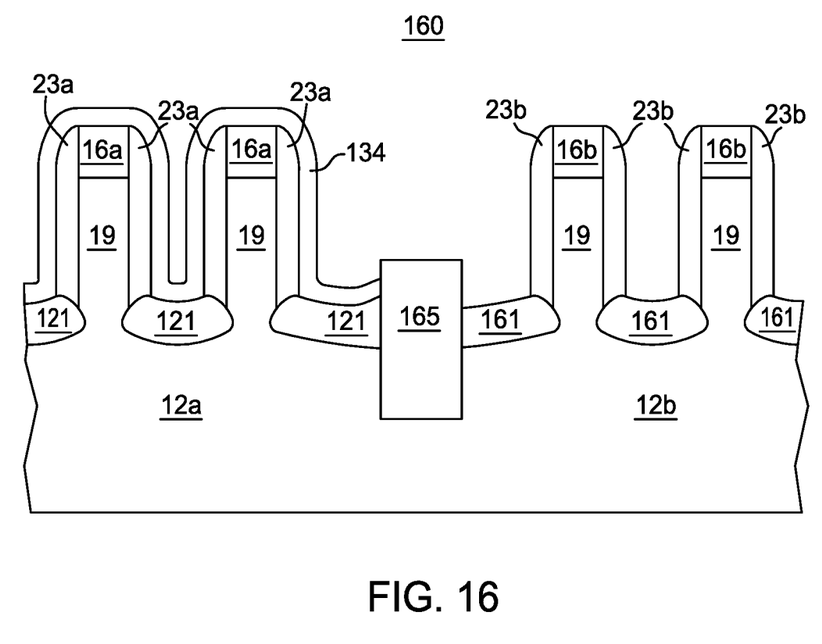
FIG. 16 illustrates formation of a shallow-trench isolation (STI) layer for a semiconductor device with nFET and pFET regions in accordance with at least one embodiment of the present disclosure.

FIG. 15 illustrates growth of a suitable source/drain epitaxy for a pFET region with respect to structure 140. FIG. 16 illustrates removal of the liner 134 after the epitaxial growth and formation of an STI region 165, resulting in structure 160. As shown in FIG. 15, a suitable source/drain epitaxy for a pFET region 161 is grown in accordance with the techniques discussed herein, e.g. boron-doped SiGe, where the liner 134 prevents the growth from carrying over to the nFET side. Thereafter, the liner 134 is removed in a similar fashion as discussed for hardmask removal herein, or as otherwise known. The STI region 165 is formed in between 101a and 101b, where 121 and 161 contact each other. Any suitable technique for forming an STI region 165 can be used, including trench formation and subsequent deposition of an insulator or dielectric material, e.g. an oxide and/or nitride, in the trench. Since the oxide plug(s) 41c was the same for both regions, and although the topography of each source/drain epitaxy alternates (sloping upwards and downwards), the topography of 121 and 161 is uniform and substantially identical (where "substantially identical" means identical but for minor variations inherent in processing steps of semiconductor manufacturing processes), thus enhancing device performance. Although not shown, vertical transistor finalization steps can be applied to structure 160 to provide a finished device, e.g. contact formation, gate formation, inter-layer dielectric formation, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A vertical transistor structure comprising:
a substrate;
a plurality of fins over the substrate;
a top source/drain region and a bottom source/drain region in contact with the plurality of fins, respectively, wherein the bottom source/drain region has an alternating topography, wherein the alternating topography comprises a hump formed by rising and falling slopes;
a bottom spacer in contact with the bottom source/drain region, wherein the bottom spacer conforms to the rising and falling slopes of the hump; and
a gate comprising a first surface in a facing relationship with a second surface of the bottom spacer, wherein the first surface conforms to rising and falling slopes of the second surface.

2. The structure according to claim 1, wherein:
the gate is in contact with the plurality of fins; and
a top spacer is positioned over the gate.

3. The structure of claim 1, wherein the plurality of fins comprises straight fins.

4. The structure of claim 1, wherein the bottom source/drain region is contained in at least one groove opening in the substrate and between two of the plurality of fins.

5. A semiconductor structure comprising:
a substrate;
a plurality of fins for an nFET region over the substrate;
a plurality of fins for a pFET region over the substrate;
a bottom source/drain region for the nFET region, wherein the nFET bottom source/drain region is in contact with the nFET plurality of fins;
a bottom source/drain region for the pFET region, wherein the pFET bottom source/drain region is in contact with the pFET plurality of fins,
wherein the nFET source/drain region and the pFET source/drain region have a substantially identical alternating topography with respect to each other, wherein the substantially identical alternating topography comprises a hump formed by rising and falling slopes;
a first bottom spacer in the nFET region and a second bottom spacer in the pFET region, wherein the first bottom spacer and the second bottom spacer conform to the rising and falling slopes of their respective humps;
a first gate in the nFET region, wherein a first surface of the first gate includes a facing relationship with a second surface of the first bottom spacer, and wherein the first surface of the first gate conforms to rising and falling slopes of the second surface of the first bottom spacer; and
a second gate in the pFET region, wherein a first surface of the second gate includes a facing relationship with a second surface of the second bottom spacer, and wherein the first surface of the second gate conforms to the rising and falling slopes of the second surface of the second bottom spacer.

6. The structure of claim 5, wherein the bottom source/drain region for the nFET region and the bottom source/drain region of the pFET region are contained in one or more groove openings in the substrate.

7. The structure of claim 6, wherein the substantially identical topography is determined by the one or more groove openings in the substrate.

8. The structure of claim 5, wherein the plurality of fins for the nFET region and the plurality of fins for the pFET region comprise straight fins.

9. The structure of claim 5, wherein the nFET region and the pFET region are separated by an isolation region.

10. The structure of claim 9, wherein the isolation region contacts a portion of the nFET source/drain region and a portion of the pFET source/drain region.

* * * * *